United States Patent
Horinouchi et al.

[11] Patent Number: 5,128,972
[45] Date of Patent: Jul. 7, 1992

[54] MEMORY PACKAGE SYSTEM

[75] Inventors: Shinichi Horinouchi, Yokohama; Kunihiko Takeuchi, Kawasaki; Masao Oba, Yokohama, all of Japan

[73] Assignee: Tokyo Keiki Company Ltd., Tokyo, Japan

[21] Appl. No.: 483,464

[22] Filed: Feb. 22, 1990

[30] Foreign Application Priority Data

Mar. 22, 1989 [JP] Japan ................................ 1-69979

[51] Int. Cl.$^5$ ........................................... H04L 23/00
[52] U.S. Cl. ..................................... 375/121; 455/41; 365/189.01; 369/59
[58] Field of Search ................... 455/41; 375/35, 121, 375/6; 365/66, 100, 189, 189.01, 189.04; 369/61, 59; 364/424.04; 370/69.1

[56] References Cited
U.S. PATENT DOCUMENTS
4,858,133  8/1989  Takeuchi et al. ............... 364/424.04

Primary Examiner—Benedict V. Safourek
Assistant Examiner—Tesfaldet Bocure
Attorney, Agent, or Firm—Wenderoth, Lind & Ponack

[57] ABSTRACT

Bidirectional transmission of write and read data is effected between a reader/writer unit and a memory module in a contactless manner using electromagnetic induction coupling. A single magnetic induction coupling apparatus is provided for each of the reader/writer unit and the memory module. In the electromagnetic induction coupling apparatus of the reader/writer unit, a transmitting coil and a receiving coil are coaxially wound around a single magnetic core. In the electromagnetic induction coupling apparatus of the memory module, a single coil which is commonly used for transmission and reception is wound around a single magnetic core. A reception signal of the transmitting-/receiving coil of the memory module is rectified and smoothed by a power source circuit, thereby forming an operating power source of the memory module. The power source circuit has a backup capacitor. In the transmitting mode in which no power source is externally supplied, the operating power source is supplied from the backup capacitor.

6 Claims, 5 Drawing Sheets

MEMORY PACKAGE SYSTEM

BACKGROUND OF THE INVENTION

The present invention relates to a memory package system for effecting the data communication between a reader/writer unit and a memory module in a contactless manner using electromagnetic induction coupling and, more particularly, to a memory package system which can effect communications using a simple and small-sized coil structure.

Hitherto, as a data communication system using electromagnetic induction coupling, for instance, a system as shown in FIG. 1 has been known (see U.S. Pat. No. 4,855,994).

As shown in FIG. 1, a reader/writer unit 10 is provided with a controller 12 for outputting a read access command, a write access command, a bit transfer request, and data (1 or 0). Transmission data which is transmitted from the controller 12 to a memory module 20 is frequency modulated by a modulating circuit 14 and amplified by an amplifier 16 and, thereafter, is supplied to a transmitting coil 18.

A receiving coil 22 is provided in the memory module 20 so as to confront the transmitting coil 18 of the reader/writer unit 10. A reception signal induced in the receiving coil 22 is rectified and regulated by a power source circuit 24 and is used as an internal power source. The reception signal of the coil 22 is also demodulated into a data bit by a demodulating circuit 26 and is applied to a memory controller 28.

When the memory controller 28 receives the write access command from the reader/writer 10 unit, the memory controller enables a non-volatile memory 30, thereby allowing write data, which is sent subsequently to the write access command, to be written into a designated address in the memory 30.

On the other hand, when the read access command is received from the reader/writer 10 unit, the memory controller 28 reads out the data stored in the address of the memory 30 which was designated by the read access command. Then, the memory controller sends the readout data to a multiplexer 36 on a bit-by-bit basis at every bit transfer request from the reader/writer 10 side unit. The multiplexer 36 switches its output between frequencies $f_1$ and $f_2$ of sine wave oscillators 32 and 34 in correspondence to the data bit 1 or 0 and is transmitted to the reader/writer 10 side unit through a transmitting coil 40.

At the reader/writer 10 unit, the transmission signal from the memory module 20 is received by a receiving coil 42 and amplified by an amplifier 44. Thereafter, the amplified signal is demodulated to the original data bit 0 or 1 by a filter 46 and is input to the controller 12.

However, in such a conventional memory package system for executing data communication using electromagnetic induction coupling, the power source circuit does not include back-up capabilities and a relatively large amount of electric power is required to transmit data from the memory module to the reader/writer unit. Therefore, even when data is transmitted from the memory module to the reader/writer unit, a power source transmission signal must be also sent from the reader/writer unit to the memory module.

Consequently, two sets of induction coils are necessary to communicate between the reader/writer unit and the memory module and two induction coils wound around an E-type core must be provided at two positions of a package of the memory module. Thus, the surface area of the package increases by the amount of the areas where two coils are arranged, thus presenting and there is a problem in that the memory module cannot be miniaturized.

SUMMARY OF THE INVENTION

It is an object of the present invention to provide a memory package system which permits the memory module to be miniaturized.

Another object of the invention is to provide a memory package system in which a single magnetic induction coupling apparatus constructed of a magnetic core and an induction coil is provided for each of a reader/writer unit and a memory module.

Still another object of the invention is to provide a memory package system in which a single induction coil provided in a memory module is switched and used in dependence on a receiving mode and a transmitting mode.

Still another object of the invention is to provide a memory package system in which a transmitting coil and a receiving coil are coaxially wound around a single magnetic core of a reader/writer unit and communication is effected between the reader/writer unit and a memory module.

Still another object of the invention is to provide a memory package system in which a reception signal from a reader/writer unit is rectified to form an internal power source and is also used to charge a backup capacitor, and in the transmitting mode in which no reception signal is obtained from the reader/writer unit, a power source for transmission is received from the capacitor.

Still another object of the invention is to provide a memory package system in which two kinds of M series signals are transmitted from a memory module in accordance with a data bit 1 or 0, and in the reader/writer unit, the received data bit is demodulated by correlation calculations of a reception signal and the M series reference signals.

Still another object of the invention is to provide a memory package system in which when data is transmitted from a reader/writer unit to a memory module, a frequency code signal comprising a combination of a preamble, a terminator, data, and a terminator is transmitted.

That is, according to the present invention, there is provided a memory package system for bidirectionally transmitting data between a reader/writer unit and a memory module by electromagnetic induction coupling.

In such a memory package system, according to the invention, the reader/writer unit is provided with a first magnetic induction coupling apparatus in which a coil for transmitting data and a coil for receiving data are coaxially wound around a single core.

On the other hand, the memory module is provided with a second magnetic induction coupling apparatus in which a single induction coil used for reception and transmission is wound around a single magnetic core.

In the case where an operating power source from the reader/writer unit to the memory module is supplied by electromagnetic induction coupling, there are provided a power source circuit to rectify a reception signal of the single induction coil provided for the memory module and a backup capacitor to charge an output voltage of the power source circuit. When the power supply which is transmitted from the memory module is shut out, the power supply is effected by the capacitor. On the other hand, the backup capacitor can also be commonly used as a smoothing capacitor in the power source circuit.

Therefore, since it is sufficient to merely provide a single induction coil for the memory module, the surface area of the package of the memory module can be reduced and the memory module can be miniaturized. When data is transmitted from the memory module to the reader/writer unit, the memory module cannot receive an externally supplied power supply source. However, by providing the backup capacitor, even if the external power supply is temporarily stopped, the operating power source can be maintained. Further, if a smoothing capacitor to eliminate ripples in the power source circuit is also used as a backup capacitor, there is no need to provide any special capacitor.

The above objects, features, and advantages of the present invention will become more apparent from the following detailed description with reference to the accompanying drawings.

DETAILED DESCRIPTION OF PREFERRED EMBODIMENTS

Figure 1:
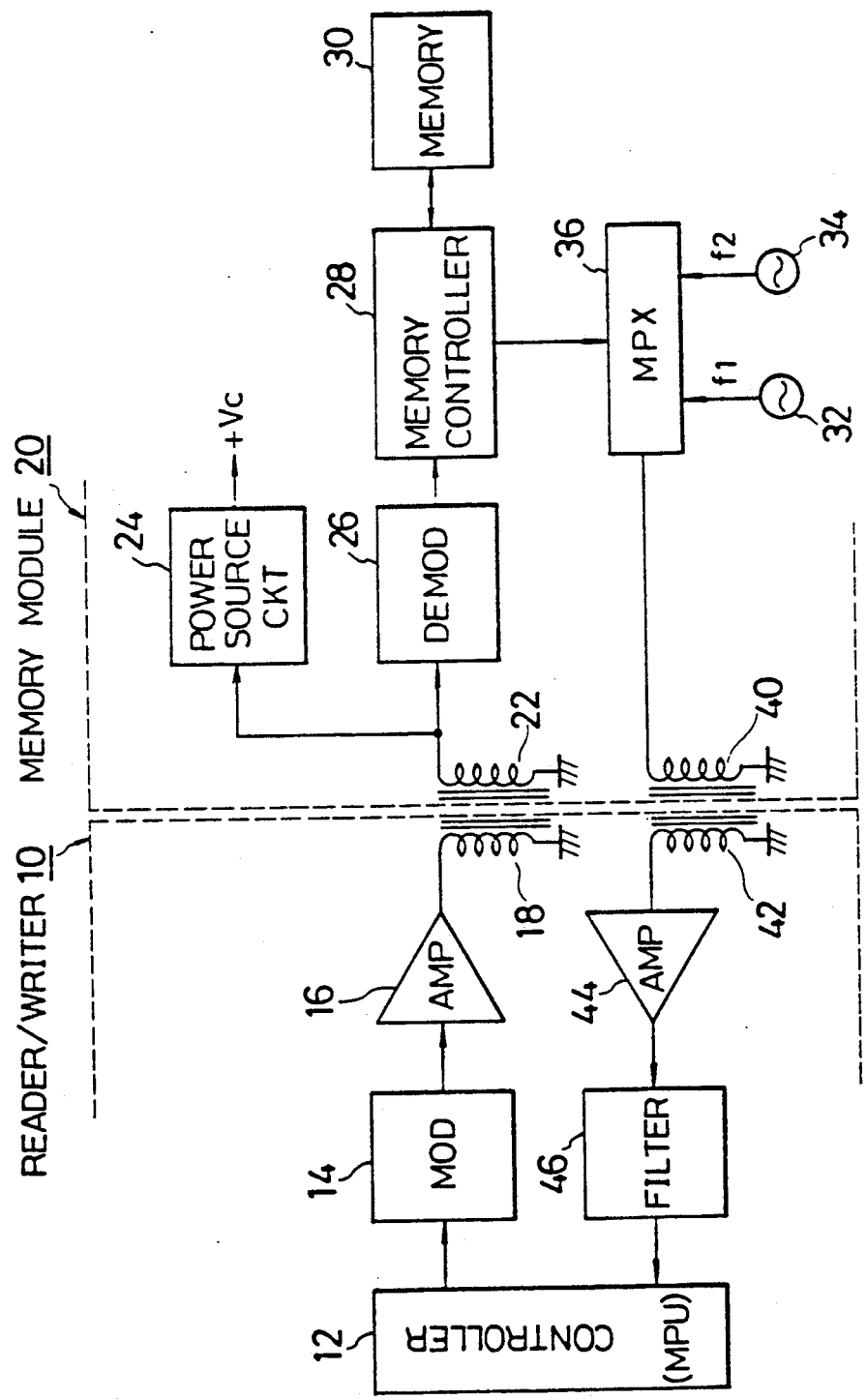
FIG. 1 is a circuit diagram of a conventional system.
Figure 2:
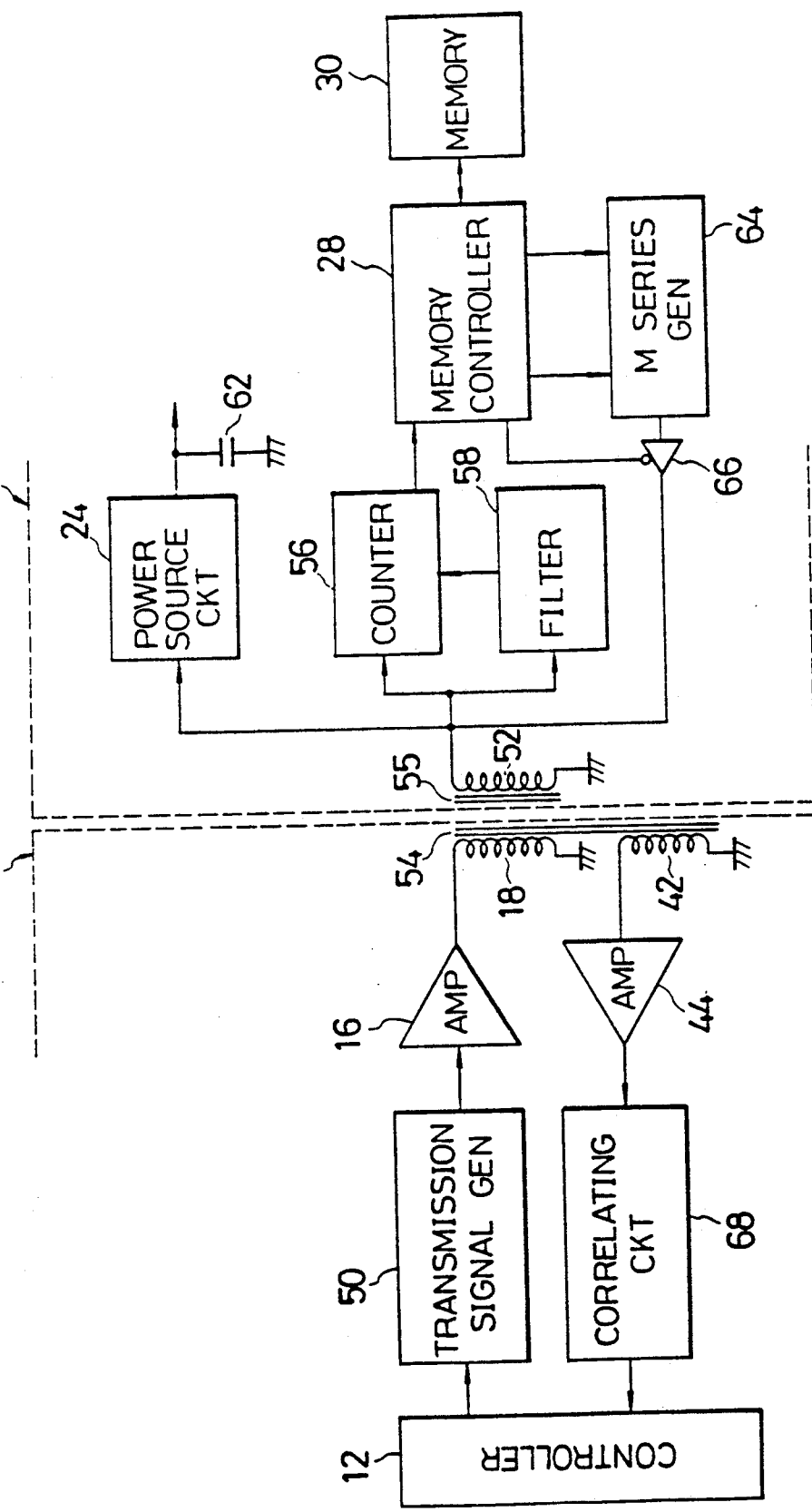
FIG. 2 is a circuit diagram of an embodiment of the present invention.

In FIG. 2, reference numeral unit 10 denotes the reader/writer unit and reference numeral 20 denotes the memory module. In the embodiment, data is transmitted and an operating power source is supplied from the reader/writer 10 unit to the memory module 20. On the other hand, data is transmitted from the memory module 20 to the reader/writer unit 10. The reader/writer unit 10 is provided with a controller 12 for outputting a read access command, write access command, transmission data (1 or 0), bit transfer request, and the like. The commands from the controller 12 are applied to a transmission signal generator 50.

The transmission signal generator 50 generates a transmission signal comprising a combination of two different frequencies $f_1$ and $f_2$ on the basis of a command from the controller 12. The transmission signal is a frequency code signal comprising: a preamble (64 waves or more at $f_2$); a terminator (2 waves at $f_1$); command data a number of waves according to a command $f_2$); and a terminator (2 waves at $f_1$). The number of waves of the third command data in the code signal is determined in the following manner. For instance,

| [command] | [the number of waves] |
|---|---|
| read sync clock | 8–15 |
| data bit 1 | 16–23 |
| data bit 0 | 24–32 |
| chip select ON | 32–39 |
| chip select OFF | 40–47 |

-continued

| [command] | [the number of waves] |
|---|---|
| test | 48–55 |

The transmission signal generated from the transmission signal generator 50 is amplified by the amplifier 16 and, thereafter, it is supplied to the transmitting coil 18. The transmitting coil 18 and a receiving coil, 42 are coaxially wound around a same core 54 provided for the reader/writer unit 10.

A coil 52 used for transmission and reception is wound around a core 55 provided in the memory module 20 so as to confront the transmitting coil 18 of the reader/writer unit 10.

The reception signal induced in the coil 52 is applied to a counter 56 and a filter 58. The filter 58 detects the reception signal of the frequency $f_1$ indicative of a terminator and executes the latch output of a count value of the counter at that time and the resetting of the counter for the subsequent counting operation. The counter 56 counts the number of waves which are included in the reception signal, that is, the number of waves of an instruction according to the preamble and command in the transmission signal generator 50. The count value is output to the memory controller 28. On the basis of the count number (the number of waves) of the frequency $f_2$ which was output from the counter 56, the memory controller 28 discriminates whether the command is one of a read access command, write access command, a data transmission bit of 1 or 0, and bit transfer request.

For instance, if the memory controller 28 determines that the input data denotes the write access command on the basis of the number of waves indicated by the count value of the counter 56, the memory controller 28 enables the memory 30 and writes the write data which is sent after the write access command into a designated address in the memory, 30. A non-volatile memory such as an EEPROM or the like, is used as a memory 30.

On the other hand, if the memory controller 28 discriminates the read access command from the count value of the counter 56, the memory controller 28 reads out the data stored of the address in the memory 30 which was designated by the read access command. The memory controller 28 then outputs the read data to an M series generator 64 on a bit-by-bit basis at every bit transfer request output from the reader/writer unit 10.

The bit transfer based on the bit transfer request of the read data which was read out in response to the read access command of the memory controller 28 is executed by the M series generator 64 and a 3-state buffer 66.

The M series generator 64 generates an M series signal as a kind of pseudo random series having different predetermined word lengths in accordance with the data bit 1 or 0. For instance, in the case of the M series of a 63 word length ($=2^N-1$) consisting of N=6 bits, the $M_1$ series signal is generated when the data bit is set to 1. The $M_0$ series signal is generated when the data bit is set to 0.

When data is read out one bit by one bit and is sent using the M series generator 64, the 3-state buffer 66 is set into the enable state and outputs the $M_0$ or $M_1$ series signal from the M series generator 64 to the coil 52. In association with the read access, the 3-state buffer 66 is disenabled in a mode other than the transmitting mode to execute the bit transmission and is set to a high impedance when it is seen from the coil 52 side.

The M series signal transmitted to the reader/writer unit 10 through the coil 52 of the memory module 20 is induced in the receiving coil 42 provided in the reader/writer unit 10 and is amplified by the amplifier 44. Thereafter, the amplified signal is input to a correlating circuit 68.

The same signals as the $M_0$ and $M_1$ series signals generated from the M series generator 64 on the memory module 20 are stored as reference values into a reference value memory in the correlating circuit 68. For instance, a reference value $R_0$ is stored for the $M_0$ series signal. A reference value $R_1$ is stored for the $M_1$ series signal. The correlating circuit 68 calculates the correlations between the reception signal obtained through the amplifier 44 and the reference values $R_0$ and $R_1$.

For instance, in the case of the reception signal of the $M_0$ series, it has a 63-word length. Therefore, for example, assuming that a generating period of the $M_0$ series signal is set to $T_1$ (S) and a sampling period is set to $T_2$ (S), the reception signal is sampled and stored into shift registers of $n=(T_1/T_2 63)$ stages which are provided in the correlating circuit 68. When reception signals $S_l$ to $S_n$ are obtained until the $n = (T_1/T_2 \times 63)$ stages of the shift registers, the correlations between those reception signals and reference values $R_1$ to $R_n$ in the reference value memory are calculated.

The correlation calculation is executed by the following equation.:

$$C = \sum_{n=1}^{n} R_n \cdot S_n$$

That is, the sampled reception signals $S_l$ to $S_n$ and the reference values $R_l$ to $R_n$ are respectively input to a multiplier and are multiplied. Thereafter, the sum of the resultant values is obtained.

A value C of the correlation calculation is maximum when the reception signal and the reference value belong to the same M series. Therefore, the correlation value obtained using the reference value of the $M_0$ series and the correlation value obtained using the reference value of the $M_1$ series are compared. When the correlation value in the case of using the reference value of the $M_0$ series is larger than the correlation value in the case of using the reference value of the $M_1$ series, or when the former correlation value is a predetermined amount larger than the latter correlation value, the data bit 0 is output. In the opposite case, the data bit 1 is output.

Figure 3:
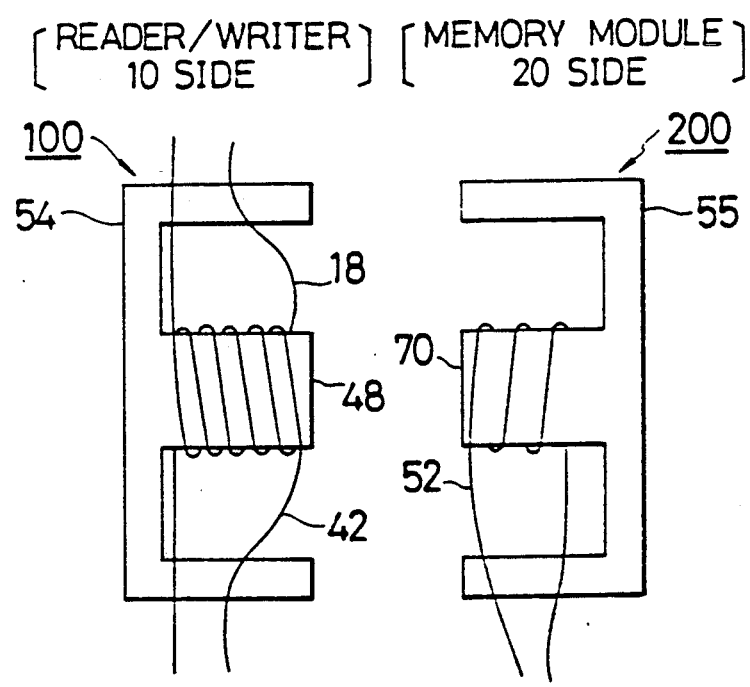
FIG. 3 is an explanatory diagram of a electromagnetic induction coupling coils according to the invention.

FIG. 3 is an explanatory diagram showing the magnetic induction coupling apparatus of each of the reader/writer unit 10 and memory module 20 shown in FIG. 2.

In FIG. 3, a magnetic induction coupling apparatus 100 of the reader/writer unit 10 is constructed such that the transmitting coil 18 and receiving coil 42 are coaxially wound around a center pole 48 of the core 54 having an E-type cross section, that is, the pot-type core 54.

On the other hand, a magnetic induction coupling apparatus 200 of the memory module 20 is constructed such that the transmitting/receiving coil 52 is wound around a center pole 70 of the pot-type core 55 having an E-type cross section similar to the core 54.

In the case of executing a power supply and a data transmission between the reader/writer 10 and the memory module 20, the cores 54 and 55 are arranged so that the center poles 48 and 70 of the cores 54 and 55 and the edge surfaces of the peripheral poles thereof face each other through a predetermined gap, respectively. A magnetic circuit is formed by the cores 54 and 55 through the gap. Signal transmission and reception are executed between the cores 54 and 55 by (last occurrence) electromagnetic induction coupling.

Further, to raise a transmitting efficiency between the reader/writer 10 and the memory module 20, it is desirable to wind the coils 18, 42, and 52 to the cores 54 and 55 at positions near the edge surfaces of the center poles 48 and 70, respectively.

Figure 4:
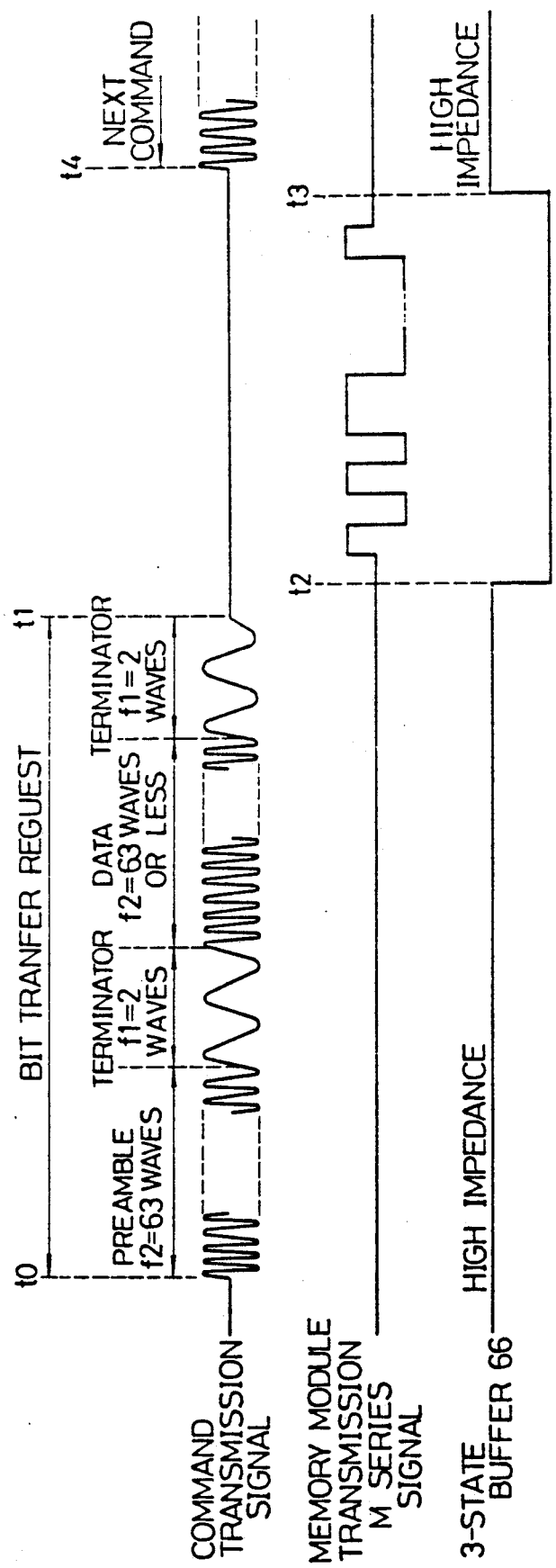
FIG. 4 is an operation timing chart depicting a case in which a bit transfer request is sent subsequently to a read access command in the embodiment of FIG. 2.

FIG. 4 shows an operation timing chart in the case where a bit transfer request is output subsequent to a read command from the reader/writer unit 10 in the embodiment of FIG. 2.

When the read access command is supplied from the controller 12 of the reader/writer unit 10 to the transmission signal generator 50, the generator 50 generates a transmission signal similar to that of by the bit transfer request shown in FIG. 4. Since the read access command denotes the read access, the number of waves at frequency $f_2$ showing the data subsequent to the preamble and terminator is equal to the number corresponding to the read access command. After the transmission signal from the generator 50 is amplified by the amplifier 16, it is supplied to the transmitting coil 18, so that a signal voltage is induced in the transmitting/receiving coil 52 of the memory module 20 which faces the transmitting coil 18. The signal voltage induced in the coil 52 is rectified by the power source circuit 24 and a power source is supplied to the internal circuit and charges a backup capacitor 62. On the other hand, the number of waves of the reception signal of the coil 52 is counted by the counter 56. When the waves of the terminator at the frequency $f_1$ are detected by the filter 58, the count value of the counter 56 at that time is latched and output to the memory controller 28. After that, the counter is reset. Therefore, after the memory controller 28 receives the count value 63 corresponding to the number at waves of the frequency $f_2$ as a preamble from the counter 56, the memory controller 28 receives the count value at the number of waves of the frequency $f_2$ indicative of the read access command and discriminates the read access command. Then, the memory controller 28 sets the memory 30 into the enable state, thereby reading out the data in the designated address.

Upon completion of the read access from the reader/writer unit 10, as shown at time to in FIG. 4, the transmission signal to instruct the bit transfer request comprising the preamble, terminator, data, and terminator is transmitted from the reader/writer unit 10. Each time the transmission signal is sent from the reader/writer unit 10, the counter 56 counts the number of waves of the frequency $f_2$ demoting the preamble and then counts the number of waves of the frequency $f_2$ showing the bit transfer request and supplies the count values to the memory controller 28.

When the memory controller 28 receives the count value of the counter 56 indicative of the data at time $t_1$, the memory controller 28 determines that the input data indicates the bit transfer request from the count value of the counter 56. Thus, the memory controller 28 outputs the first bit of the read data which has already been read out of the memory 30 to the M series generator 64 and switches the 3-state buffer 66 to the enable state from the disenable state which has been held in the high impedance state so far.

After the data bit 1 or 0 is received from the memory controller 28, the M series generator 64 generates the M₀ series signal when, for instance, the data bit is 0. The M₁ series signal is generated when the data bit is 1. That is, for the time interval between time $t_2$ and time $t_3$, the M series signal from the M series generator 64 is supplied to the transmitting/receiving coil 52 through the 3-state buffer 66 in the enable state. When the transmission of the M series signal is finished at time $t_3$, the memory controller 28 again returns the 3-state buffer 66 to the disenable state in the high impedance state.

The M series signal transmitted from the memory module 20 is induced in the receiving coil 42 of the reader/writer unit 10 and amplified by the amplifier 44. The correlations between the amplified M series signal and the reference values $R_0$ and $R_1$ of the two M series signals which have previously been stored in the correlating circuit 68 are then calculated. By the correlation calculation, the data bit 1 or 0 corresponding to the M series corresponding to the reference value in which the correlation value is larger, or is a predetermined amount larger than the other correlation value is output to the controller 12.

In a manner similar to the above, the M series signal is repetitively transmitted every bit transfer request until the bit transmission of all of the read data is completed.

As mentioned above, in the case of using the M series, even a very weak signal can be transmitted from the memory module 20 to the reader/writer unit 10 without any error. Even in the case of using a backup power source by a capacitor of a low power supply capability, the communication of a long distance exceeding ten and a few cm can be performed.

Figure 5:
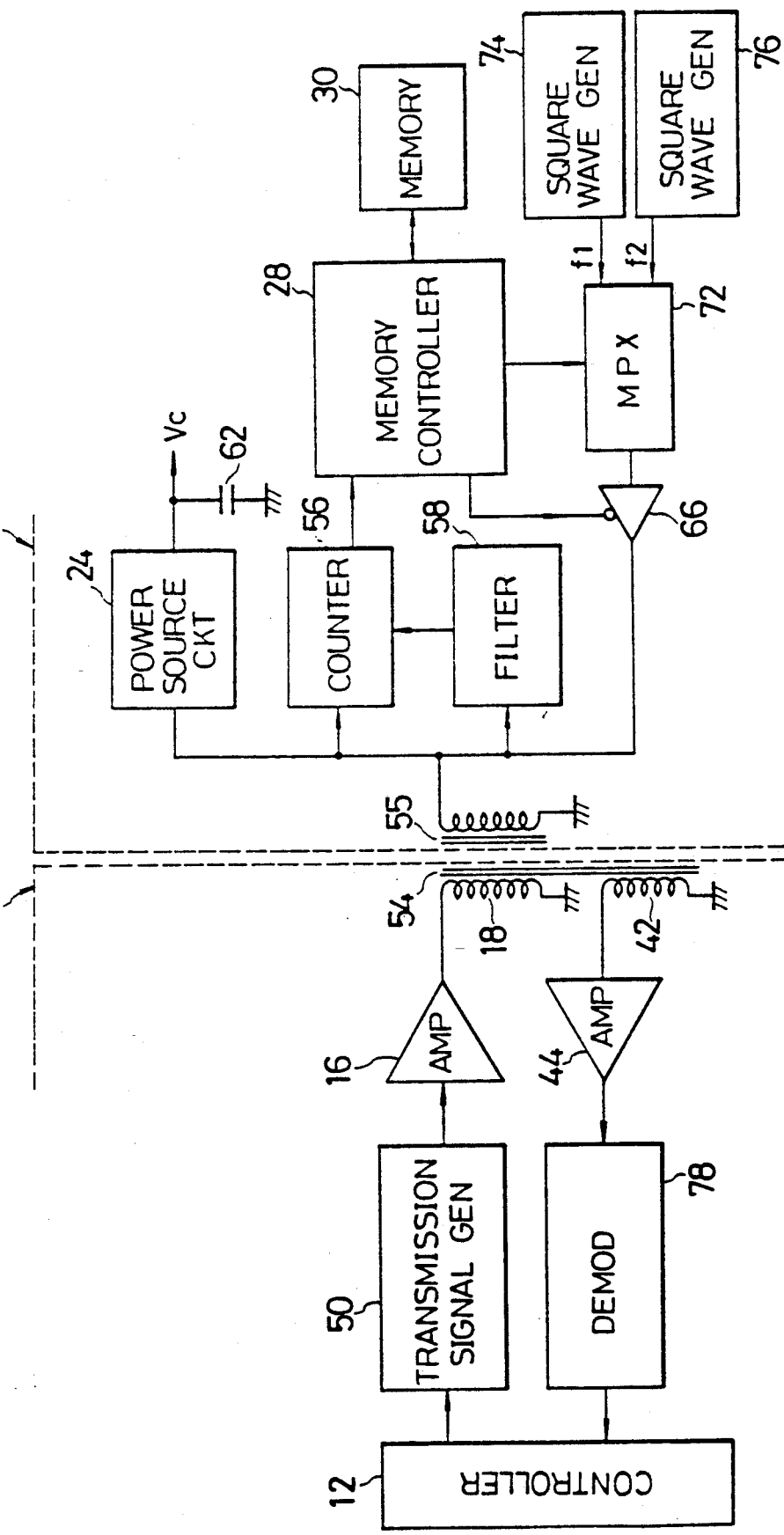
FIG. 5 is a circuit diagram of another embodiment of the invention.

FIG. 5 is a constructional circuit diagram showing another embodiment of the invention. The embodiment is characterized in that in response to the bit transfer request from the reader/writer unit 10, the data bits 1 and 0 are frequency modulated by the different frequencies $f_1$ and $f_2$ and sent to the reader/writer unit 10 from the memory module 20.

In FIG. 5, a circuit construction for the read access commands or write access from the reader/writer 10 to the memory module 20 is the same as that shown in FIG. 2.

On the other hand, is a circuit to transmit the data bit by bit from the memory module 20 upon a read access command each time the bit transfer request is sent, a frequency modulating circuit is provided comprising a multiplexer 72 and rectangular wave generators 74 and 76.

That is, when the data bit 0 is output from the memory controller, the multiplexer 72 selects the frequency $f_1$ from the generator 74. On the other hand, when the data bit 1 is output from the memory controller 28, the multiplexer 72 selects the frequency $f_2$ from the generator 76.

The rectangular wave signal of the frequency $f_1$ or $f_2$ which was selected by the multiplexer 72 in accordance with the data bit 0 or 1 is supplied to the transmitting/receiving coil 52 through the 3-state buffer 66 in the enable state. A signal voltage is induced in the receiving coil 42 of the reader/writer 10 unit. After the reception signal of the receiving coil 42 is amplified by the amplifier 44 it is applied to a demodulating circuit 78. The demodulating circuit 78 outputs the data bit 0 when the receiving frequency is set to $f_1$ and outputs the data bit 1 when the receiving frequency is set to $f_2$.

In the embodiment o FIG. 2, in response to the bit transfer request, the different M series signal corresponding to the data bit 0 or 1 is transmitted from the memory module 20 and the data bit is demodulated at the reader/writer 10 unit by the correlation calculation. However, two kinds of chirp waves, gold series, further, barker codes or the like corresponding to the data bits 0 and 1 can be also used as pseudo random signals other than the M series signals.

Further, with respect to the data transmission from the reader/writer unit 10 to the memory module 20, as shown in FIG. 2, the M series signal corresponding to the data bit 0 or 1 is transmitted, the correlations between the M series signal and the reference value are calculated at the memory module 20, and the data bit can be also regenerated.

Further, although the backup capacitor 62 has been provided in the memory module 20 separately from the power source circuit 24, if the smoothing capacitor to eliminate the ripples which is provided in the power source circuit 24 is used to back up, there is no need to newly add the capacitor 62. That is, in place of providing two large power source capacitors having large capacitances, by using one capacitor, the package size of the memory module 20 can be reduced.

What is claimed is:

1. A memory package system comprising a read/write unit and a memory module, wherein bidirectional transmission of write data and read data is effected between said memory module and said read/write unit via electromagnetic induction coupling, said read/write unit comprising:

(a) a first electromagnetic induction coupling device which includes a transmitting coil and a receiving coil coaxially wound around a single core;

(b) down modulating means for modulating down transmission data which is to be transmitted to the memory module and for applying thus modulated down transmission data to said transmitting coil of said first electromagnetic induction coupling device; and (c) up demodulating means for demodulating as up reception data a signal induced in said receiving coil of said first electromagnetic induction coupling device, said memory module comprising:

(a) a non-volatile memory;

(b) a second electromagnetic induction coupling device which includes a single transmitting/receiving coil which is commonly used in both a receiving mode and a transmitting mode wound around a single magnetic core;

(c) down demodulating means for demodulating as down reception data a signal induced in said transmitting/receiving coil during the receiving mode;

(d) memory control means for writing and reading data into and from said non-volatile memory on the basis of the down reception data demodulated by said down demodulating means;

(e) power supply means for rectifying the down signal induced in said transmitting/receiving coil and for forming and operating power source of said memory module;

(f) up modulating mean for modulating read data which has been read out of said non-volatile memory by said memory control means;

(g) coil switching means, response to said memory control means, for supplying an output of said up modulating means to said transmitting/receiving coil only during the transmitting mode in which up transmission data is transmitted to said read/write unit; and (h) a backup capacitor for charging an output voltage of said power supply means and for supplying a power source when data is transmitted from said memory module to said read/write unit.

2. A memory package system according to claim 1, wherein said backup capacitor functions as a smoothing capacitor of said power supply means.

3. A memory package system according to claim 1, wherein said coil switching means of said memory module includes a 3-state buffer which is set into a disenable state in he receiving mode in which a high impedance is present at a connection to the transmitting/receiving coil, and which is switched into an enable state in the transmitting mode in which an output is generated corresponding to first and second logic levels.

4. A memory package system according to claim 1, wherein said up modulating means of said memory module includes frequency code generating means for generating a frequency code signal when a data bit 1 or 0 to write or read out the data into or from the nonvolatile memory or a predetermined command is input thereto, wherein said frequency code signal comprises a preamble portion having a first predetermined number of waves of a first frequency, a first terminator portion having a second predetermined number of waves of a second frequency subsequent to the preamble, a data portion having a number of waves of the first frequency which differs depending on the input data bit 1 or 0 or the command and having a number of waves which is smaller than the first predetermined number of waves of the preamble subsequent to the first terminator, and a second terminator portion having the second predetermined number of waves of the second frequency subsequent to said data portion, and wherein said down demodulating means of said memory module includes frequency code demodulating means for identifying a code generated from said frequency code generating means and included in the down reception signal of said transmitting-/receiving coil and for demodulating the data bit 1 or 0 or the command.

5. A memory package system according to claim 1, wherein said up modulating means of said memory module includes an M series generating means for generating a first M series signal and a second M series signal which differ in correspondence to bits 1 and 0 of the read data, and wherein said up demodulating means of the read/write unit includes correlation calculating means for previously storing as first and second reference values signal which are the same as the first and second M series signals, for calculating correlations between an up reception signal of said reception coil and the first and second reference values, and for outputting a data bit corresponding to the reference value of the larger one of the two calculated correlation values.

6. A memory package system according to claim 1, wherein said up modulating means of said memory module includes frequency modulating means for generating first and second frequency signals which differ in correspondence to bits 1 and 0 of the read data, and wherein said up demodulating means of the read/write unit includes frequency demodulating means for demodulating the data bit 1 or 0 from the first or second frequency signal which has been received by said receiving coil.

* * * * *